US007949237B2

(12) United States Patent
Koren et al.

(10) Patent No.: US 7,949,237 B2
(45) Date of Patent: *May 24, 2011

(54) HEATING CONFIGURATION FOR USE IN THERMAL PROCESSING CHAMBERS

(75) Inventors: Zion Koren, Sunnyvale, CA (US); Conor Patrick O'Carroll, Sunnyvale, CA (US); Shuen Chun Choy, San Francisco, CA (US); Paul Janis Timans, Mountain View, CA (US); Rudy Santo Tomas Cardema, San Jose, CA (US); James Tsuneo Taoka, San Jose, CA (US); Arieh A. Strod, Cupertino, CA (US)

(73) Assignee: Mattson Technology, Inc., Fremont, CA (US)

( * ) Notice: Subject to any disclaimer, the term of this patent is extended or adjusted under 35 U.S.C. 154(b) by 455 days.

This patent is subject to a terminal disclaimer.

(21) Appl. No.: 11/853,414

(22) Filed: Sep. 11, 2007

(65) Prior Publication Data

US 2007/0297775 A1 Dec. 27, 2007

Related U.S. Application Data

(62) Division of application No. 11/132,539, filed on May 19, 2005, now Pat. No. 7,269,343, and a division of application No. 09/747,522, filed on Dec. 21, 2000, now Pat. No. 6,970,644.

(51) Int. Cl.
*A21B 2/00* (2006.01)
*F26B 3/30* (2006.01)
*C23C 16/00* (2006.01)

(52) U.S. Cl. .......... 392/416; 118/724; 219/411

(58) Field of Classification Search .......... 392/416, 392/417, 418; 118/724, 725; 219/390, 405, 219/411
See application file for complete search history.

(56) References Cited

U.S. PATENT DOCUMENTS

| 2,318,533 | A | 5/1943 | Selvig |
| 3,200,018 | A | 8/1965 | Grossman |
| 3,427,435 | A | 2/1969 | Webb |
| 3,879,257 | A | 4/1975 | Gentile et al. |
| 3,903,342 | A | 9/1975 | Roberts, Jr. |
| 4,101,759 | A | 7/1978 | Anthony et al. |
| 4,166,001 | A | 8/1979 | Dunning et al. |
| 4,225,382 | A | 9/1980 | Kearney et al. |

(Continued)

FOREIGN PATENT DOCUMENTS

DE 4306398 9/1994

(Continued)

OTHER PUBLICATIONS

Abstract of Japanese Patent No. JP5259082, published Oct. 8, 1993.

(Continued)

*Primary Examiner* — Daniel Robinson
(74) *Attorney, Agent, or Firm* — Dority & Manning, P.A.

(57) ABSTRACT

An apparatus for heat treating semiconductor wafers is disclosed. The apparatus includes a heating device which contains an assembly linear lamps for emitting light energy onto a wafer. The linear lamps can be placed in various configurations. In accordance with the present invention, tuning devices which are used to adjust the overall irradiance distribution of the light energy sources are included in the heating device. The tuning devices can be, for instance, are lamps or lasers.

23 Claims, 6 Drawing Sheets

U.S. PATENT DOCUMENTS

| | | | |
|---|---|---|---|
| 4,234,356 A | 11/1980 | Auston et al. | |
| 4,316,074 A | 2/1982 | Daly | |
| 4,318,752 A | 3/1982 | Tien | |
| 4,344,818 A | 8/1982 | Nuttall et al. | |
| 4,375,993 A | 3/1983 | Mori et al. | |
| 4,414,038 A | 11/1983 | Dausinger et al. | |
| 4,468,279 A | 8/1984 | Itzkan | |
| 4,487,635 A | 12/1984 | Kugimiya et al. | |
| 4,547,651 A | 10/1985 | Maruyama | |
| 4,550,684 A | 11/1985 | Mahawili | |
| 4,571,486 A | 2/1986 | Arai et al. | |
| 4,615,765 A | 10/1986 | Levinson et al. | |
| 4,672,740 A | 6/1987 | Shirai et al. | |
| 4,719,122 A | 1/1988 | Yamazaki | |
| 4,755,654 A | 7/1988 | Crowley et al. | |
| 4,761,538 A | 8/1988 | Chiba et al. | |
| 4,780,590 A | 10/1988 | Griner et al. | |
| 4,836,138 A | 6/1989 | Robinson et al. | |
| 4,959,245 A | 9/1990 | Dobson et al. | |
| 4,975,561 A | 12/1990 | Robinson et al. | |
| 5,155,336 A | 10/1992 | Gronet et al. | |
| 5,179,677 A | 1/1993 | Anderson et al. | |
| 5,215,588 A | 6/1993 | Rhieu | |
| 5,222,112 A | 6/1993 | Terasawa et al. | |
| 5,253,324 A | 10/1993 | Wortman | |
| 5,255,286 A | 10/1993 | Moslehi et al. | |
| 5,268,989 A | 12/1993 | Moslehi et al. | |
| 5,278,938 A | 1/1994 | Spigarelli et al. | |
| 5,304,357 A | 4/1994 | Sato et al. | |
| 5,317,492 A | 5/1994 | Gronet et al. | |
| 5,317,656 A | 5/1994 | Moslehi et al. | |
| 5,326,171 A | 7/1994 | Thompson et al. | |
| 5,336,641 A | 8/1994 | Fair et al. | |
| 5,345,534 A | 9/1994 | Najm et al. | |
| 5,364,667 A | 11/1994 | Rhieu | |
| 5,367,606 A | 11/1994 | Moslehi et al. | |
| 5,368,647 A | 11/1994 | Suzuki | |
| 5,399,523 A | 3/1995 | Kakoschke | |
| 5,418,885 A | 5/1995 | Hauser et al. | |
| 5,436,172 A | 7/1995 | Moslehi | |
| 5,444,815 A | 8/1995 | Lee et al. | |
| 5,445,675 A * | 8/1995 | Kubodera et al. | 118/719 |
| 5,446,825 A | 8/1995 | Moslehi et al. | |
| 5,487,127 A | 1/1996 | Gronet et al. | |
| 5,493,987 A | 2/1996 | McDiarmid et al. | |
| 5,504,831 A | 4/1996 | Sandhu et al. | |
| 5,523,262 A | 6/1996 | Fair et al. | |
| 5,532,457 A | 7/1996 | Cobb et al. | |
| 5,536,918 A | 7/1996 | Ohkase et al. | |
| 5,587,019 A | 12/1996 | Fujie | |
| 5,612,251 A | 3/1997 | Lee | |
| 5,635,409 A | 6/1997 | Moslehi | |
| 5,648,005 A | 7/1997 | Cobb et al. | |
| 5,656,132 A | 8/1997 | Farrington, Jr. et al. | |
| 5,683,173 A | 11/1997 | Gronet et al. | |
| 5,689,614 A | 11/1997 | Gronet et al. | |
| 5,695,607 A | 12/1997 | Oriaran et al. | |
| 5,719,991 A | 2/1998 | Sandhu et al. | |
| 5,743,643 A | 4/1998 | Gronet et al. | |
| 5,762,713 A | 6/1998 | Paranjpe | |
| 5,767,486 A | 6/1998 | Gronet et al. | |
| 5,790,751 A | 8/1998 | Gronet et al. | |
| 5,795,396 A | 8/1998 | Ishihara et al. | |
| 5,814,365 A | 9/1998 | Mahawili | |
| 5,820,942 A * | 10/1998 | Singh et al. | 427/508 |
| 5,840,125 A | 11/1998 | Gronet et al. | |
| 5,851,629 A | 12/1998 | Oriaran et al. | |
| 5,861,609 A | 1/1999 | Kaltenbrunner et al. | |
| 5,874,711 A | 2/1999 | Champetier et al. | |
| 5,882,479 A | 3/1999 | Oriaran et al. | |
| 5,886,320 A | 3/1999 | Gallo et al. | |
| 5,908,307 A | 6/1999 | Talwar et al. | |
| 5,911,890 A | 6/1999 | Dulaney et al. | |
| 5,913,974 A | 6/1999 | Habuka | |
| 5,930,456 A | 7/1999 | Vosen | |
| 5,932,068 A | 8/1999 | Farrington, Jr. et al. | |
| 5,937,142 A | 8/1999 | Moslehi et al. | |
| 5,954,982 A | 9/1999 | Sogard | |
| 5,958,185 A | 9/1999 | Vinson et al. | |
| 5,960,158 A | 9/1999 | Gat et al. | |
| 5,970,214 A | 10/1999 | Gat | |
| 5,970,382 A | 10/1999 | Shah | |
| 5,980,637 A | 11/1999 | Singh et al. | |
| 5,997,175 A | 12/1999 | Champetier et al. | |
| 6,001,175 A | 12/1999 | Maruyama et al. | |
| 6,016,383 A * | 1/2000 | Gronet et al. | 392/416 |
| 6,017,418 A | 1/2000 | Oriaran et al. | |
| 6,019,850 A | 2/2000 | Frey | |
| 6,027,244 A | 2/2000 | Champetier et al. | |
| 6,033,523 A | 3/2000 | Dwiggins et al. | |
| 6,033,761 A | 3/2000 | Dwiggins et al. | |
| 6,034,357 A | 3/2000 | Guardado | |
| 6,051,104 A | 4/2000 | Oriaran et al. | |
| 6,056,434 A | 5/2000 | Champetier | |
| 6,068,731 A | 5/2000 | Dwiggins et al. | |
| 6,075,922 A | 6/2000 | Tay et al. | |
| 6,080,965 A | 6/2000 | Osawa | |
| 6,103,063 A | 8/2000 | Oriaran et al. | |
| 6,113,740 A | 9/2000 | Oriaran et al. | |
| 6,122,439 A | 9/2000 | Gronet et al. | |
| 6,143,131 A | 11/2000 | Dwiggins et al. | |
| 6,153,053 A | 11/2000 | Harper et al. | |
| 6,160,242 A | 12/2000 | Guardado | |
| 6,174,651 B1 | 1/2001 | Thakur | |
| 6,200,023 B1 | 3/2001 | Tay et al. | |
| 6,204,484 B1 | 3/2001 | Tay et al. | |
| 6,210,484 B1 | 4/2001 | Hathaway | |
| 6,222,990 B1 | 4/2001 | Guardado et al. | |
| 6,258,614 B1 | 7/2001 | Kaneko | |
| 6,281,141 B1 | 8/2001 | Das et al. | |
| 6,293,696 B1 | 9/2001 | Guardado | |
| 6,303,411 B1 * | 10/2001 | Camm et al. | 438/149 |
| 6,310,328 B1 | 10/2001 | Gat | |
| 6,329,105 B1 | 12/2001 | Fujita et al. | |
| 6,359,263 B2 | 3/2002 | Tay et al. | |
| 6,403,923 B1 | 6/2002 | Tay et al. | |
| 6,437,290 B1 | 8/2002 | Shao et al. | |
| 6,514,876 B1 | 2/2003 | Thakur et al. | |
| 6,531,681 B1 | 3/2003 | Markle et al. | |
| 6,559,424 B2 | 5/2003 | O'Carroll et al. | |
| 6,570,656 B1 | 5/2003 | Owens, Jr. et al. | |
| 6,610,967 B2 | 8/2003 | Gat | |
| 6,628,371 B1 * | 9/2003 | Ishikawa | 355/69 |
| 6,638,876 B2 | 10/2003 | Levy et al. | |
| 6,650,480 B2 | 11/2003 | Tanaka | |
| 6,657,154 B1 | 12/2003 | Tanabe et al. | |
| 6,693,257 B1 | 2/2004 | Tanaka | |
| 6,717,158 B1 | 4/2004 | Gat et al. | |
| 6,727,474 B2 | 4/2004 | Gat | |
| 6,747,245 B2 | 6/2004 | Talwar et al. | |
| 6,770,146 B2 | 8/2004 | Koren et al. | |
| 6,771,895 B2 | 8/2004 | Gat et al. | |
| 6,797,312 B2 | 9/2004 | Kong et al. | |
| 6,805,466 B1 * | 10/2004 | Ranish | 362/247 |
| 6,808,758 B1 | 10/2004 | Thakur | |
| 6,835,914 B2 | 12/2004 | Timans | |
| 6,875,691 B2 | 4/2005 | Li et al. | |
| 6,879,777 B2 | 4/2005 | Goodman et al. | |
| 6,884,719 B2 | 4/2005 | Chang et al. | |
| 6,902,622 B2 | 6/2005 | Johnsgard et al. | |
| 7,015,422 B2 | 3/2006 | Timans | |
| 7,038,173 B2 | 5/2006 | Takahashi et al. | |
| 2002/0017618 A1 | 2/2002 | Gat et al. | |
| 2002/0027716 A1 | 3/2002 | Tanaka | |
| 2002/0104619 A1 | 8/2002 | Koren et al. | |
| 2002/0105275 A1 | 8/2002 | Shigeoka | |
| 2002/0137311 A1 | 9/2002 | Timans | |
| 2002/0150395 A1 | 10/2002 | Shimizu et al. | |
| 2003/0031793 A1 | 2/2003 | Chang et al. | |
| 2003/0124820 A1 | 7/2003 | Johnsgard et al. | |
| 2003/0196993 A1 | 10/2003 | Jennings | |
| 2003/0196995 A1 | 10/2003 | Jennings | |
| 2003/0196996 A1 | 10/2003 | Jennings et al. | |
| 2003/0209326 A1 | 11/2003 | Lee et al. | |
| 2003/0235983 A1 | 12/2003 | Li et al. | |
| 2003/0236642 A1 | 12/2003 | Timans | |
| 2004/0025787 A1 | 2/2004 | Selbrede et al. | |

| | | |
|---|---|---|
| 2004/0035847 A1 | 2/2004 | Gat |
| 2004/0058557 A1 | 3/2004 | Eisele et al. |
| 2004/0063290 A1 | 4/2004 | Jennings et al. |
| 2004/0084427 A1 | 5/2004 | Talwar et al. |
| 2004/0084437 A1 | 5/2004 | Timans |
| 2005/0006916 A1 | 1/2005 | Mantz |
| 2005/0008351 A1 | 1/2005 | Gat et al. |
| 2005/0098552 A1 | 5/2005 | Timans |

FOREIGN PATENT DOCUMENTS

| | | |
|---|---|---|
| EP | 0476307 | 3/1992 |
| EP | 0505928 | 9/1992 |
| EP | 0576791 | 1/1994 |
| EP | 0618329 | 10/1994 |
| EP | 0675225 | 10/1995 |
| EP | 0811709 A2 | 12/1997 |
| EP | 0821084 A1 | 1/1998 |
| EP | 0811709 A3 | 8/1998 |
| GB | 2130009 | 5/1984 |
| WO | WO 9513424 | 5/1995 |
| WO | WO 9852214 | 11/1998 |
| WO | WO 9958733 | 11/1999 |
| WO | WO 0145501 | 6/2001 |

OTHER PUBLICATIONS

Abstract of German Patent No. DE4306398, published Sep. 8, 1994.

Abstract of Patent No. EP0505928, published Sep. 30, 1992.

Article—*Absorption of Infrared Radiation in Silicon*, I.W. Boyd, T.D. Binnie, J.I.B. Wilson, and M. J. Colles, J. Appl. Phys. 55 (8), Apr. 15, 1984, pp. 3061-3063.

Article—*Application of Rapid Thermal Processing in Manufacturing: The Effect of Emissivity and Coupling*, James S. Nakos, pp. 421-428.

Article—*Beam Processing in Silicon Device Technology*, C. Hill, Laser and Electron-Beam Solid Interactions and Materials Process, 1981, pp. 361-374.

Article—*Reduced Thermal Processing for ULSI*, C. Hill, S. Jones, and D. Boys, Rapid Thermal Annealing—Theory and Practice, pp. 143-180.

Article—*Temperature measurement in rapid thermal processing*, Paul J. Timans, Solid State Technology, Apr. 1997, 6 pages.

Article—*The Effect of Multilayer Patterns on Temperature Uniformity during Rapid Thermal Processing*, Jeffrey P. Hebb and Klavs F. Jensen, J. Electrochem. Soc., vol. 143, No. 3, Mar. 1996, pp. 1142-1151.

Internet Publication from Intellectual Property Network—"Pseudo Brewster Angle Of Incidence For Joining Or Removing A Chip By Laser Beam." pp. 5194-5195 dated Apr. 1981.

Publication title "Some Features Of Laser Heating Of Oxidizable Metals In Air By Obliquely Incident Radiation" by M. I. Arzuov, A. I. Barchukov, F. V. Bunkin, N. A. Kirichenko, V. I. Konov, and B. S. Luk'yanchuck. Sov. J. Quantum Electro. 9(10), Oct. 1979.

Article—*Alignment of grain boundary in a Si film crystallized by a linearly polarized laser beam on a glass substrate*, Horita et al., Applied Physics Letters, vol. 78, No. 15, Apr. 9, 2001, pp. 2250-2252.

Article—*Influence of the beam irradiation condition with oblique incidence on crystallization of an Si film by a linearly polarized pulse laser*, Nakata et al., Mat. Res. Soc. Symp. Proc., vol. 715, 2002, pp. A22.1.1-A22.1.6.

Article—*Effect of Polarization on Laser-Induced Surface-Temperature Rise*, Lu et al., Applied Physics A (Solids and Surfaces), vol. 58, 1994, pp. 423-429.

Article—*Rapid direct writing of high-aspect-ratio trenches in silicon*, Treyz et al., Applied Physics Letters, vol. 50, No. 8, Feb. 23, 1987, pp. 475-477.

Article—*Rapid direct writing of high-aspect-ratio trenches in silicon*, Treyz et al., Journal of Vacuum Science & Technology B: Microelectronics and Nanometer Structures, vol. 6, No. 1, Jan. 1998, pp. 37-44.

* cited by examiner

HEATING CONFIGURATION FOR USE IN THERMAL PROCESSING CHAMBERS

RELATED APPLICATIONS

The present application claims priority to and is a divisional application of U.S. Ser. No. 11/132,539 filed on May 19, 2005, now U.S. Pat. No. 7,269,343 and U.S. Ser. No. 09/747,522 filed on Dec. 21, 2000 and now U.S. Pat. No. 6,970,644.

BACKGROUND OF THE INVENTION

A thermal processing chamber as used herein refers to a device that rapidly heats objects, such as semiconductor wafers. Such devices typically include a substrate holder for holding a semiconductor wafer and a light source that emits light energy for heating the wafer. During heat treatment, the semiconductor wafers are heated under controlled conditions according to a preset temperature regime. For monitoring the temperature of the semiconductor wafer during heat treatment, thermal processing chambers also typically include temperature sensing devices, such as pyrometers, that sense the radiation being emitted by the semiconductor wafer at a selected band of wavelengths. By sensing the thermal radiation being emitted by the wafer, the temperature of the wafer can be calculated with reasonable accuracy.

In alternative embodiments, instead of or in addition to using radiation sensing devices, thermal processing chambers can also contain thermocouples for monitoring the temperature of the wafers. Thermocouples measure the temperature of objects by direct contact.

Many semiconductor heating processes require a wafer to be heated to high temperatures so that various chemical and physical reactions can take place as the wafer is fabricated into a device. During rapid thermal processing, which is one type of processing, semiconductor wafers are typically heated by an array of lights to temperatures, for instance, from about 400° C. to about 1,200° C., for times which are typically less than a few minutes. During these processes, one main goal is to heat the wafers as uniformly as possible.

Problems have been experienced in the past, however, in being able to maintain a constant temperature throughout the wafer and in being able to control the rate at which the wafer is heated. If the wafer is heated nonuniformly, various unwanted stresses can develop in the wafer. Not being able to heat the wafers uniformly also limits the ability to uniformly deposit films on the wafers, to uniformly etch the wafers, beside limiting the ability to perform various other chemical and physical processes on the wafers.

Temperature gradients can be created within the wafer due to various factors. For instance, due to the increased surface area to volume ratio, the edges of semiconductor wafers tend to have a cooling rate and a heating rate that are different than the center of the wafer. The energy absorption characteristics of wafers can also vary from location to location. Additionally, when gases are circulated in the chamber, the gases can create cooler areas on the wafer due to convection.

In the past, various lamp configurations have been proposed in order to overcome the above described deficiencies and improve the ability to heat wafers more uniformly and to control the temperature of the wafers at various locations. These systems, however, have become increasingly complex and expensive to produce. For instance, some systems can contain well over 100 lamps.

As such, a need currently exists for an improved thermal processing chamber that is capable of uniformly heating semiconductor wafers in a relatively simple manner without being as complex as many prior art systems. A need also exists for an improved rapid thermal processing chamber for heating semiconductor wafers that is equipped with controls for varying the amount of energy that is applied to the wafer at different locations based upon the characteristics and properties of the wafer. Such controls are especially necessary due to the increasing demands that are being placed upon the preciseness at which the semiconductor wafers are heat treated and at which semiconductor devices are fabricated.

SUMMARY OF THE INVENTION

The present invention is generally directed to an apparatus for heat treating semiconductor wafers. The apparatus includes a thermal processing chamber adapted to contain a semiconductor wafer. For instance, a substrate holder can be contained within the chamber upon which the wafer is held. A heating device is placed in communication with the thermal processing chamber which emits thermal light energy onto the wafer held on the substrate holder. The heating device can include an assembly of light energy sources which are positioned, for instance, to heat different zones of the wafer. The light energy sources form an irradiance distribution across a surface of the wafer.

In particular, the light energy sources used in the present invention are linear lamps positioned above the wafer, below the wafer, or above and below the wafer. Linear lamps are elongated lamps that are typically oriented horizontally with respect to the wafer being heated. Although the lamps can be any shape, such as circular, for most applications, the lamps have a long rod-like shape that extend the length of the wafer being heated, such as from one end of the thermal processing chamber to the other. For example, a series of rod-like lamps positioned parallel to each other, can be located over the wafer.

During the heating process, the semiconductor wafer can be rotated. In this manner, the light energy sources form radial heating zones on the wafer which aid in heating the wafer uniformly and provide good temporal control during the heating cycle.

In accordance with the present invention, the heating device further includes at least one tuning device positioned amongst the linear lamps. The tuning device is configured to change the irradiance distribution of the linear lamps in a manner for more uniformly heating the semiconductor wafer.

The tuning devices proved localized temperature control on the wafer. Through the combination of linear lamps and tuning sources, the present invention allows the processing system to achieve a better temperature uniformity across the wafer or a better realization of a desired temperature profile. In one embodiment, the system can also be used to radially fine tune the whole wafer for further improving temperature uniformity.

The tuning device used in the present invention can be any suitable lamp or lamp configuration that is capable of directing a focused light beam onto a certain location of a substrate. For instance, in one embodiment, the tuning device can be a laser. The laser can emit p-polarized light onto the wafer. In order to maximize absorption, the laser can be adjusted so that the angle of incidence corresponds to where reflectivity of the light at the particular wavelength is at a minimum. For example, when processing silicon wafers, the angle of incidence can be generally less than 90°, and particularly from about 40° to about 85°.

Further, since most lasers emit light at a particular wavelength, in an alternative embodiment of the present invention, multiple lasers can be used that emit light at different wavelengths. By using different types of lasers, problems associated with reflectivity can be minimized.

Besides lasers, arc lamps can also be used as the tuning device. Arc lamps are well suited to emitting light that can be focused onto a particular portion of the wafer. When used in the system of the present invention, an arc lamp can be coupled to a light pipe and at least one focusing lens for directing light being emitted by the arc lamp onto a particular location.

The system of the present invention can include as many tuning devices as are required for uniformly heating wafers. The number of tuning devices incorporated into a particularly system will generally depend upon numerous factors, including the configuration of the light energy sources.

In order to control the amount of light energy that is emitted by the plurality of light energy sources, the apparatus of the present invention can include at least one temperature sensing device which senses the temperature of the wafer at a plurality of locations. For instance, the temperature sensing device can be a plurality of pyrometers, one pyrometer with multiple viewing ports, or one or more thermocouples. The temperature sensing devices can be in communication with a controller, such as a microprocessor, which determines the temperature of the wafer. The controller, in turn, can be in communication with the power supply of the linear lamps for controlling the amount of heat being emitted by the light energy sources in response to the temperature of the wafer. The controller can be configured, for instance, to control the amount of light energy being emitted by each linear lamp or can control different groups of the light energy sources.

In one embodiment, the controller can be configured to also control the amount of light energy that is being emitted by a tuning device installed in accordance with the present invention. In particular, the controller can be used to control the tuning device independent of the linear lamps. Further, the controller can also be configured to be capable of automatically moving the support structure upon which the tuning device is mounted in order to change and adjust the location of where the light energy being emitted by the tuning device contacts the wafer.

Other features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Figure 1:
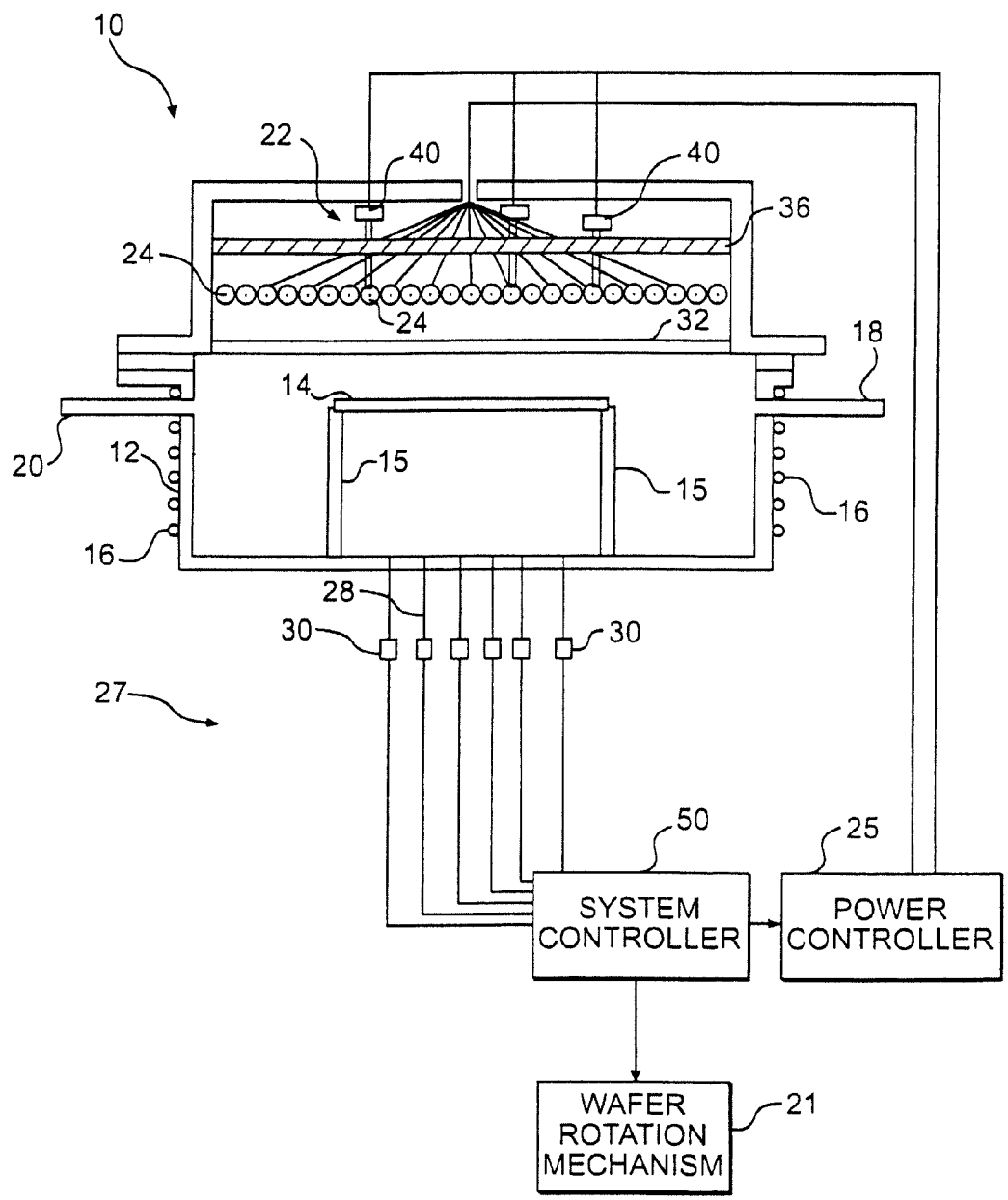
FIG. 1 is a cross-sectional view of one embodiment of a thermal processing chamber that may be used in accordance with the present invention.

Repeat use of reference characters in the present specification and drawings is intended to represent same or analogous features or elements of the invention.

DETAILED DESCRIPTION OF THE PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary construction.

A rapid thermal processing apparatus uses intense light to heat a semiconductor wafer as part of the manufacturing process of integrated circuits. Exposure to light energy causes a rapid increase in the temperature of a semiconductor wafer and allows processing times to be relatively short. In rapid thermal processing systems, it is important to radiate the wafer with very high intensity light in a very uniform and controlled fashion. As stated above, the difficulty with current devices is that the requirements for the intensity of the radiated light and the ability to heat wafers uniformly are very difficult to achieve.

In general, the present invention is directed to an apparatus and method for heating semiconductor wafers uniformly and at a controlled rate. The apparatus includes a thermal processing chamber in communication with a heating device that is used to heat treat semiconductor wafers contained in the chamber. The heating device contains a plurality of lamps that are positioned at preselected locations for heating the wafers. The lamps emit light energy and form a irradiance distribution over the surface of the wafer.

The heating device and processing chamber of the present invention are particularly designed to operate with linear lamps. As used herein, a "linear lamp" refers to a lamp that is designed to emit most of its energy through the longest dimension of the lamp. For instance, in most embodiments, linear lamps emit the majority of their energy through the side of the lamp. Thus, when heating semiconductor wafers, the lamps are typically horizontally oriented over and/or below the wafers.

Recently, as opposed to using linear lamps, many thermal processing chambers have been made with vertically oriented lamps. These lamps are designed to emit energy out of an end of the lamp for heating the wafers. The present inventors have discovered that using linear lamps provide various advantages over vertical lamps. For instance, when using linear lamps, a much smaller number of lamps are required to be incorporated into the heating device, since a linear lamp can heat a much larger area than a vertical lamp. Because less lamps are required, the system generally becomes more reliable and easier to maintain. Further, the linear lamps provide good heating uniformity and make it much easier to heat a wafer from both sides of the wafer.

During heating, the wafer is rotated with respect to the plurality of lamps. In this manner, the lamps form radial heating zones on the wafer. The energy supplied to each heating zone can be controlled while the wafer is being heated.

In one embodiment, the temperature at different locations of the wafer is monitored. Based upon the temperature sensed at the different locations, the energy being emitted by the lamps is selectively controlled.

In accordance with the present invention, the heating device in communication with the thermal processing chamber further contains tuning devices which are designed to modify the irradiance distribution of the heating lamps for more uniformly heating the semiconductor wafer. The tuning devices allow fine adjustments to be made to the wafer irradiance distribution pattern in order to heat the wafer under a more controlled temperature regime and more uniformly. The tuning device can be, in one embodiment, a localized and focused source of light energy that can be directed onto a particular location on the wafer.

The tuning device can be an active localized source such as a tungsten halogen bulb in an optical configuration, an arc lamp, or a laser diode with relatively high power.

Referring to FIG. 1, a system generally 10 made in accordance with the present invention for heat treating a wafer made from a semiconductive material, such as silicon, is illustrated. System 10 includes a processing chamber 12 adapted to receive substrates such as a wafer 14 for conducting various processes. As shown, wafer 14 is positioned on a substrate holder 15 made from a thermal insulating material such as quartz. Chamber 12 is designed to heat wafer 14 at very rapid rates and under carefully controlled conditions. Chamber 12 can be made from various materials, including metals and ceramics. For instance, chamber 12 can be made from stainless steel or quartz.

When chamber 12 is made from a heat conductive material, preferably the chamber includes a cooling system. For instance, as shown in FIG. 1, chamber 12 includes a cooling conduit 16 wrapped around the perimeter of the chamber. Conduit 16 is adapted to circulate a cooling fluid, such as water, which is used to maintain the walls of chamber 12 at a constant temperature.

Chamber 12 can also include a gas inlet 18 and a gas outlet 20 for introducing a gas into the chamber and/or for maintaining the chamber within a preset pressure range. For instance, a gas can be introduced into chamber 12 through gas inlet 18 for reaction with wafer 14. Once processed, the gas can then be evacuated from the chamber using gas outlet 20.

Alternatively, an inert gas can be fed to chamber 12 through gas inlet 18 for preventing any unwanted or undesirable side reactions from occurring within the chamber. In a further embodiment, gas inlet 18 and gas outlet 20 can be used to pressurize chamber 12. A vacuum can also be created in chamber 12 when desired, using gas outlet 20 or an additional larger outlet positioned beneath the level of the wafer.

During processing, substrate holder 15, in one embodiment, can be adapted to rotate wafer 14 using a wafer rotation mechanism 21. Rotating the wafer promotes greater temperature uniformity over the surface of the wafer and promotes enhanced contact between wafer 14 and any gases introduced into the chamber. It should be understood, however, that besides wafers, chamber 12 is also adapted to process optical parts, films, fibers, ribbons, and other substrates having any particular shape.

A heat source or heating device generally 22 is included in communication with chamber 12 for heating wafer 14 during processing. Heating device 22 includes a plurality of linear lamps 24, such as tungsten-halogen lamps. As shown in FIG. 1, lamps 24 are horizontally aligned above wafer 14. It should be understood, however, that lamps 24 may be placed at any particular location such as only below the wafer or above and below the wafer. Further, additional lamps could be included within system 10 if desired.

The use of linear lamps 24 as a heat source is generally preferred. For instance, lamps have much higher heating and cooling rates than other heating devices, such as electrical elements or conventional furnaces. Lamps 24 create a rapid isothermal processing system that provide instantaneous energy, typically requiring a very short and well controlled start up period. The flow of energy from lamps 24 can also be abruptly stopped at any time. As shown in the figure, lamps 24 are equipped with a gradual power controller 25 that can be used to increase or decrease the light energy being emitted by any of the lamps.

In order to assist in directing the light energy being emitted by lamps 24 onto wafer 14, the lamps can be associated with a reflector or a set of reflectors. For instance, as shown in FIG. 1, the heating device 22 includes a reflector plate 36 positioned above the linear lamps 24. Reflector plate 36 can be made from any material suitable for reflecting light energy and can have any suitable shape that will assist in directing the light energy toward the wafer 14.

In order to monitor the temperature of wafer 14 during the heating process, in this embodiment, thermal processing chamber 12 includes plurality of radiation sensing devices generally 27. Radiation sensing devices 27 include a plurality of optical fibers or light pipes 28 which are, in turn, in communication with a plurality of corresponding light detectors 30. Optical fibers 28 are configured to receive thermal energy being emitted by wafer 14 at a particular wavelength. The amount of sensed radiation is then communicated to light detectors 30 which generate a usable voltage signal for determining the temperature of the wafer which can be calculated based, in part, on Planck's Law. In one embodiment, each optical fiber 28 in combination with a light detector 30 comprises a pyrometer. In another embodiment, the optical fibers 28 are routed to a single but multiplexing radiation sensing device.

In general, thermal processing chamber 12 can contain one or a plurality of radiation sensing devices. In a preferred embodiment, as shown in FIG. 1, thermal processing chamber 12 contains a plurality of radiation sensing devices that measure the temperature of the wafer at different locations. Knowing the temperature of the wafer at different locations can then be used to control the amount of heat being applied to the wafer as will be described in more detail hereinafter. The amount of heat applied to various zones of the wafer can also be controlled in an open loop fashion. In this configuration the ratios between the various heating zones can be pre-determined after manual optimization.

System 10 further includes a window 32 which separates lamps 24 from the chamber. Window 32 serves to isolate lamps 24 from wafer 14 and prevent contamination of the chamber. Window 32 as shown in FIG. 1 can be a window positioned between chamber 12 and heat source 22. In an alternative embodiment, each lamp 24 can be covered by a separate window casing.

Besides using radiation sensing devices, other temperature sensing devices may be used in the system of the present invention. For instance, one or more thermocouples may be incorporated into the system for monitoring the temperature of the wafer at a single location or at a plurality of locations. The thermocouples can be placed in direct contact with the wafer or can be placed adjacent the wafer from which the temperature can be extrapolated.

System 10 further includes a system controller 50 which can be, for instance, a microprocessor. Controller 50 receives voltage signals from light detectors 30 that represent the radiation amounts being sampled at the various locations. Based on the signals received, controller 50 is configured to calculate the temperature of wafer 14 at different locations.

System controller 50 as shown in FIG. 1 can also be in communication with lamp power controller 25. In this arrangement, controller 50 can determine the temperature of wafer 14, and, based on this information, control the amount of thermal energy being emitted by lamps 24. In this manner, instantaneous adjustments can be made regarding the conditions within reactor 12 for processing wafer 14 within carefully controlled limits.

In one embodiment, controller 50 can also be used to automatically control other elements within the system. For instance, controller 50 can be used to control the flow rate of gases entering chamber 12 through gas inlet 18. As shown, controller 50 can further be used to control the rate at which wafer 14 is rotated within the chamber.

As described above, the present invention is generally directed to a particular heating configuration that is used within thermal processing chamber 12. Referring to FIGS. 2 through 5, one embodiment of a heating device 22 that can be used in combination with thermal processing chamber 12 in accordance with the present invention is illustrated. As shown, heating device 22 includes a plurality of light energy sources, such as linear lamps 24 that are secured to a mounting base 34. The linear lamps 24 each have a length that extends approximately the width of the thermal processing chamber. The linear lamps 24 are placed in a parallel configuration and are horizontally oriented with respect to a wafer being heated. For example, referring to FIG. 5, the semiconductor wafer 14 is shown in phantom for providing a visual comparison between the linear lamps 24 and the diameter of the wafer.

In accordance with the present invention, in order to heat a wafer more uniformly, heating device 22 further includes tuning devices 40 which, in this embodiment, are generally positioned in between the linear lamps 24. Tuning devices 40 are designed to emit controlled and focused amounts of light energy onto particular locations of a semiconductor wafer being heated. The tuning devices are provided in order to make fine adjustments to the irradiance distribution produced by lamps 24 in order to more precisely heat the wafers. For example, tuning devices 40 can be used to emit controlled amounts of light energy between the radial heating zones located on the wafer.

Figure 2:
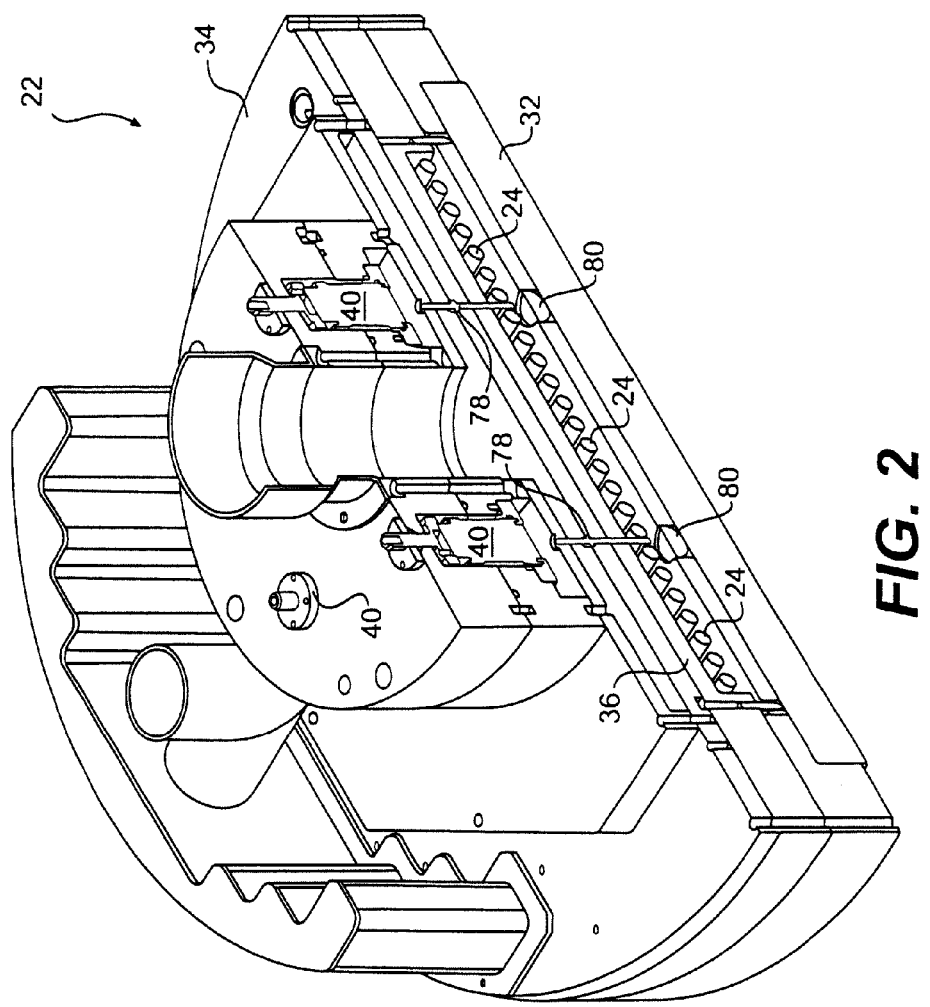
FIG. 2 is a cross-sectional perspective view of one embodiment of a heating device that may be used in thermal processing chambers made in accordance with the present invention.
Figure 3:
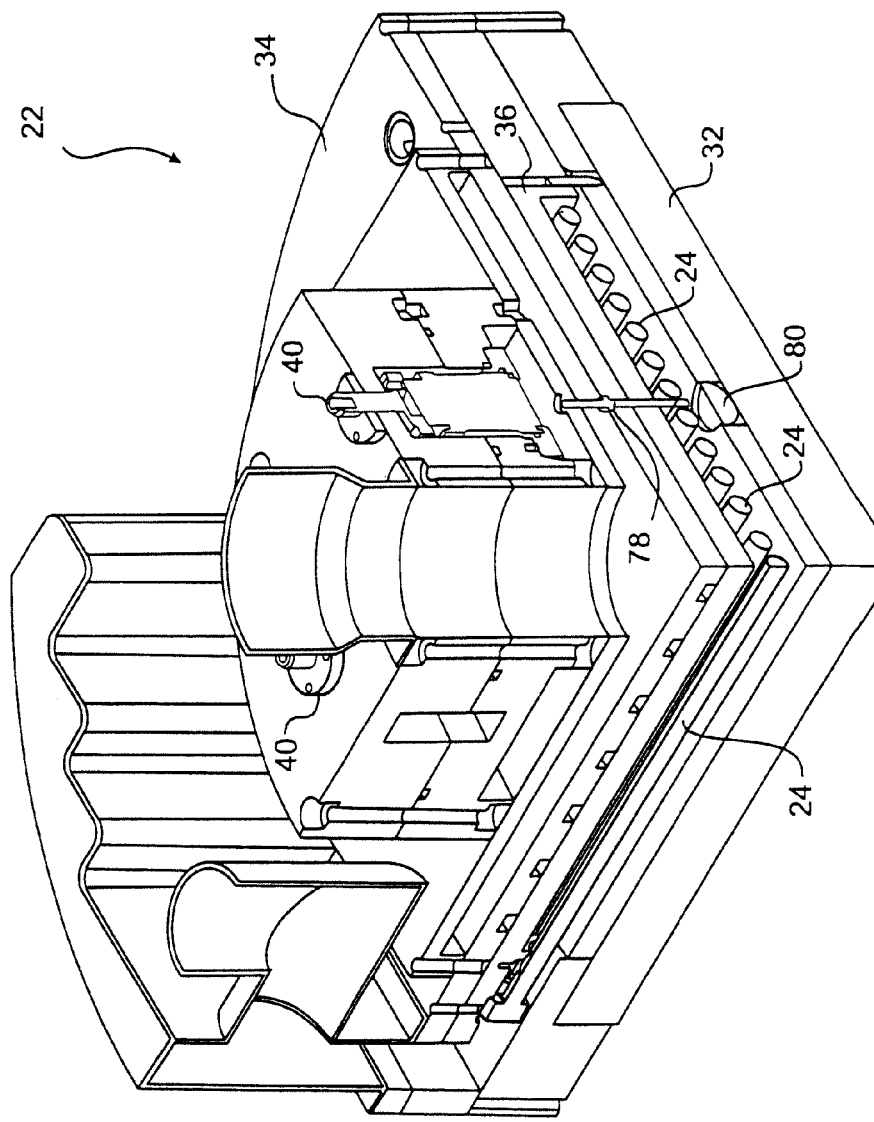
FIG. 3 is a cross-sectional perspective view of the heating device illustrated in FIG. 2.
Figure 4:
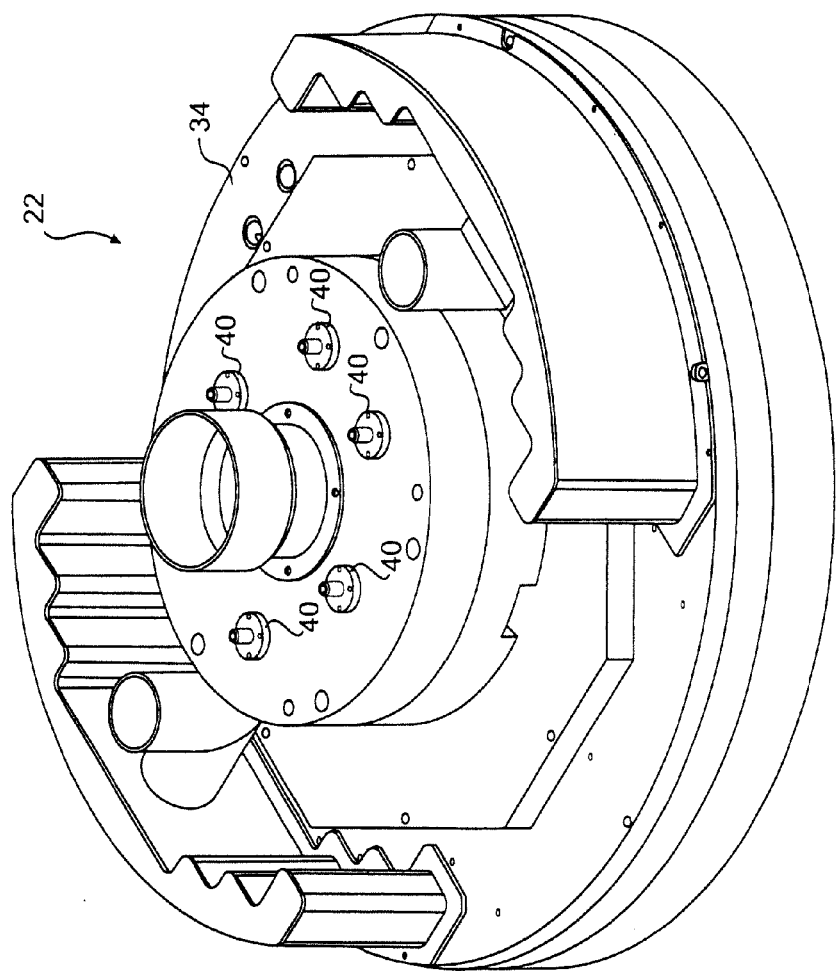
FIG. 4 is a perspective view of the heating device illustrated in FIG. 2.

Tuning devices 40 as shown in FIGS. 2 through 4 are active localized sources of focused light energy. The tuning devices can be, for instance, laser diodes having a relatively high power. For instance, the tuning source can contribute from about 1% to about 30% of the local power density irradiating the wafer at the selected position. In an alternative embodiment, tuning devices 40 can be a lamp, such as a tungsten halogen lamp or arc lamp, in operative association with one or more focusing lenses or reflectors.

In FIGS. 2 through 4, tuning devices 40 include a light energy source coupled to a light pipe or a fiberoptic 78 and a focusing lens 80. Light pipe 78 and focusing lense 80 serve to direct the light energy onto a particular location of the wafer. These elements, however, may not be necessary in all applications.

Instead of or in addition to conventional laser diodes, a tunable laser means can also be used as a laser source. The wavelength of light emitted by the tunable laser device can be adjustable. Consequently, the wavelength of the tuning source can be adapted or adjusted to the texture or state of the illuminated wafer region, which can include structures in the lateral direction and/or structures of layers of different dielectric constants. More particularly, the wavelength of the tuning source can be adjusted in order to maximize absorption.

Figure 5:
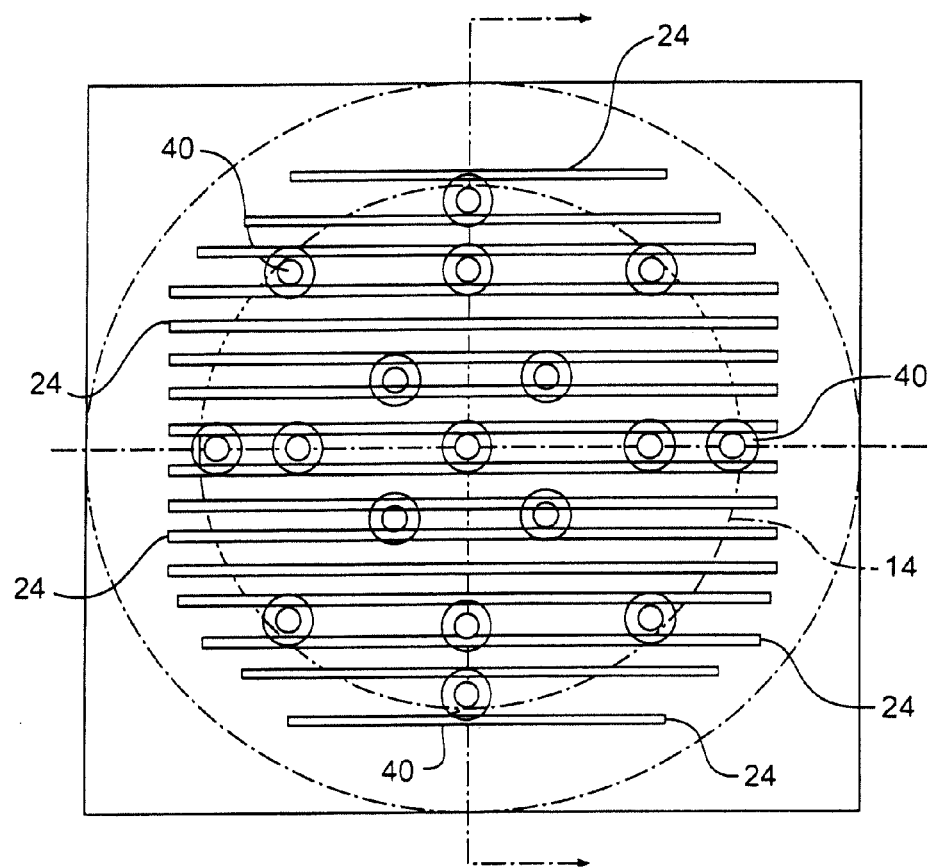
FIG. 5 is a bottom view of the heating device illustrated in FIG. 2.

The number of tuning devices 40 that may be used in a system of the present invention can vary depending upon the particular application. For most applications, however, tuning devices will be positioned so as to heat the outer edges of the wafer. As shown in FIG. 5, many other tuning devices 40 can also be included in the system.

During operation, heating device 22 is preferably in communication with a system controller 50 as shown in FIG. 1. Based upon the temperature of the wafer being heated, system controller 50 can be designed to vary the amount of light energy being emitted by lamps 24 and by tuning devices 40.

Besides light energy intensity, other parameters of the tuning device can be controlled as a function of the wafer temperature or the temperature of another part of the wafer processing system. These parameters can be controlled as a function of other parameters relevant to the processing of wafers, like e.g. process time, conditions of the processed gas such as temperature, pressure or composition, or ramp rate which refers to the rate at which the wafer is heated or cooled. Other parameters of the tuning device that can be controlled include e.g. the emitted spectrum, pulse parameters such as time, duty-factor or frequency, pulse-shape, frequency-time characteristics if the device is used in a pulse mode, the spacial position of the device relative to the wafer, the state of polarization, the size and angle of the illuminated area on the wafer, coherence in time and space, and parameters of any optical devices such as apertures, filters, lenses of various kind, mirrors which e.g. at least partly but not necessarily surround the light source of the tuning device.

Figure 6:
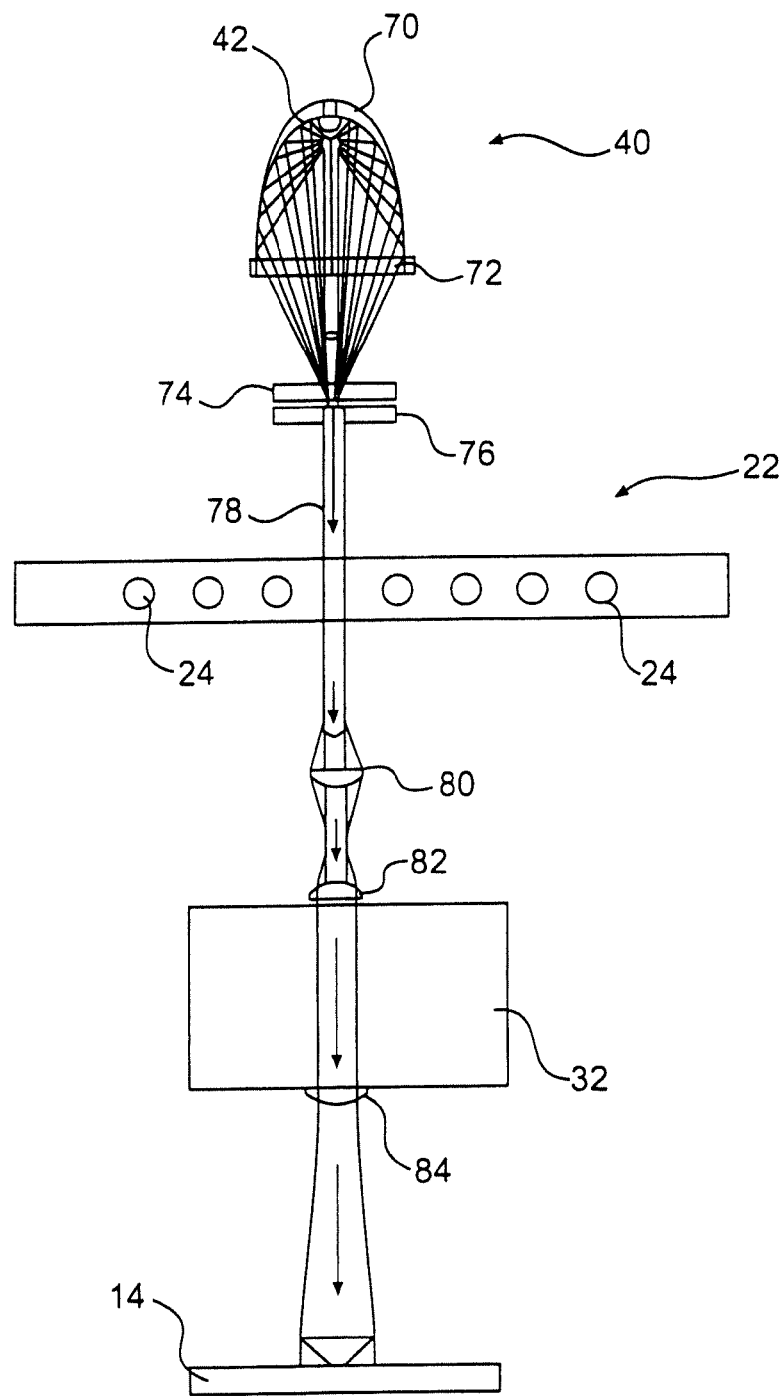
FIG. 6 is a side view of one embodiment of a tuning device made in accordance with the present invention.

Referring to FIG. 6, one embodiment of a tuning device made in accordance with the present invention is illustrated. In this embodiment, like reference numerals have been used in order to indicate similar elements as shown in the other figures. As shown, tuning device 40 includes a light energy source 42 which transmits light to a wafer 14 in a thermal processing chamber through a window 32. Light energy source 42 is positioned above heating device 22, which includes a plurality of linear lamps 24.

In this embodiment, light energy source 42 is an arc lamp that includes a cathode spaced from an anode. During operation, the cathode emits electrons that travel across the lamp arc gap and strike the anode. Arc lamps typically emit ultra violet light, infrared light, and visible light. In one embodiment, the emitted spectrum of the arc lamps can be controlled by current density. The current density can be controlled by power supply and adjusting the voltage or internal resistance of the supply. The current density, however, can also be controlled by external magnetic fields. If the arc lamps are used in a pulsed mode, a high current density is achievable, resulting in very intense emitted UV radiation.

The power level of the lamp can vary depending upon the particular application. Power levels from 125 watts to 1500 watts are available. Each of these power levels is actually a power range, with nominal power near the maximum. For most applications, however, the lamp should have a power level of from about 180 watts to about 320 watts.

As illustrated, arc lamp 42 is surrounded by a reflector 70. Reflector 70 preferably has a pure polycrystalline alumina body that is glazed with a high temperature material to give the reflector a specular surface. For instance, the reflector can be coated with a silver alloy for a visible lamp or an aluminum coating for a UV lamp and/or dielectric coating.

Reflector 70 surrounds the light energy source and can have various shapes. For instance, reflector 70 can be parabolic or elliptical. A parabolic reflector will create a collimated output beam, while an elliptical reflector will create a focused output. For most applications, preferably an elliptical reflector is used, because of its slightly better collection efficiencies and slightly shorter arc gap, while parabolic reflectors are usually used with focusing lenses.

During operation, preferably arc lamp 42 is cooled. For example the lamp can be cooled using forced air, free convention, conduction, or can be water cooled.

The cathode assembly and the anode assembly of arc lamp 42 are sealed within the reflector by a lamp window 72. Lamp window 72 can be made from, for instance, a ground and polished single-crystal sapphire.

As shown in the Figure, light emitted by arc lamp 42 is directed through a pair of apertures or "stops" 74 and 76 to block stray light. The reflector 70 focuses the light energy into a light pipe 78. One or more lenses are then used to focus the light out of the pipe and onto the wafer surface. Light pipe 78 is preferably made from a material that is well adapted for transmitting light and that is not substantially thermally conductive, such as quartz.

From light pipe 78, the light is passed through several focusing lenses prior contacting a semi-conductor wafer 14. For instance, as shown in the embodiment illustrated in FIG. 6, the system includes a first focusing lens 80, a second focusing lens 82, and a third focusing lens 84. Focusing lens 84 is positioned on the opposite side of window 32 within the thermal processing chamber in which the wafer is held. Focusing lenses 80, 82 and 84 are designed to facilitate transmission of light energy being emitted by arc lamp 42 and to focus the light onto a particular location of the wafer. In this embodiment, focusing lenses 80 and 82 comprise a condensing lens set. It should be understood, however, that the number and combination of lenses can vary depending on the application. For instance, the number of lenses can be reduced with careful lens design, such as by using an aspherical lens. Alternatively or in combination also Fresnel-Zone-Plates or other refractive and/or diffractive means and/or reflective optics (e.g. an elliptical reflector) can be used to get the desired illumination on the wafer.

Tuning device 40 as shown in FIG. 6 can be used to heat various locations of the wafer. In one embodiment, however, it has been found that this configuration is particularly well adapted to heating the outer edges of the wafer, where the wafer tends to lose heat due to radiation and convection during heating cycles. In particular, it has been found that the system illustrated in FIG. 6 is particularly well adapted to heating the outer 3 to 5 millimeters of the wafer. It should be understood, however, that tuning device 40 can be positioned to heat other locations on the wafer.

The configuration illustrated in FIG. 6 represents one embodiment of a single tuning device using an arc lamp. It should be understood that more than one tuning device may be used in a single system. Further, the location of the tuning device can vary. For instance, in an alternative embodiment, the tuning device can be below or on the side of the heater. Further, in one embodiment, wafer 14 can be heated from the top and the bottom with the tuning devices. For example, the wafer can be heated from the bottom using a separate heating device containing various tuning devices. Further, the tuning device can be arranged in a linear position with respect to the wafer or can assume an angular position with respect to the wafer.

Besides arc lamps as shown in FIG. 6, the tuning device of the present invention can also be a laser. Lasers can be used alone or in combination with arc lamps.

In general, lasers emit light at a particular wavelength. Because lasers emit a narrow spectral band of radiation, however, it may be beneficial in some applications to couple the light emission from the laser with the absorption properties of the wafer being heated. For instance, a wafer can be coated with a material or a thin-film stack that may be highly reflective at the wavelength at which the laser operates, which reduces the efficiency at which the wafer is heated by the laser. In accordance with the present invention, however, various techniques can be used to increase absorption efficiencies when using lasers.

For example, in one embodiment, several different types of lasers can be used in the heating device that each emit light at different wavelengths. Thus, when a particular substrate is highly reflective at the wavelength at which one laser operates, a second laser operating at a different wavelength can be used to heat the wafer. The radiation from the different lasers may be optically combined before contacting the wafer. Alternatively, several beams of light from the different lasers could illuminate a selected area of the wafer. In still another alternative embodiment, several beams of light could irradiate the same wafer radius as the wafer is rotated.

In addition to using multiple lasers at different wavelengths, the position of each laser can be arranged so as to maximize absorption. More specifically, absorption can be maximized by adjusting the plane of polarization and the angle of incidence of light being emitted by the laser with respect to the surface of the wafer.

For instance, the reflectivity of most surfaces is a function of the angle of incidence. Thus, changing the angle of incidence of the laser light contacting the wafer can increase absorption. In this embodiment, the laser sources can all be angled so as to maximize absorption for a particular wafer. Alternatively, the angle of incidence of each laser source can be different so as to ensure that at least one of the tuning sources will have a high degree of absorption during the heating process. The angle of incidence can also be a parameter which is controlled by the system controller 50 as a function of another parameter in the system, such as those mentioned above.

For most applications, when adjusting the angle of incidence, the laser beams of light should be placed in the p-polarization plane with respect to the wafer surface. The p-polarization plane is where in the electric field vector of the incident radiation lies in the plane of incidence. The plane of incidence is the plane containing the incident beam and the normal to the wafer surface. For light with this polarization, the reflectivity of many materials, including silicon, can become small for angles of incidence of less than 90°. In particular, reflectivity, which can be a function of temperature, is very low such as almost zero near a critical angle i.e. the Brewster angle. For silicon, the Brewster angle is approximately 75°. Since laser beams are often inherently polarized, altering the angle of incidence when using lasers can be particularly effective in accordance with the present invention.

For example, in one embodiment, when using a laser, the angle of incidence can be from about 40° to about 85° and particularly from about 60° to about 85° when heating a silicon wafer.

In general, any suitable type of laser can be used in the present invention. In one embodiment, a laser diode is used. Laser diodes efficiently convert electricity into laser radiation and are available in high power ratings. For example, high power devices, delivering continuous power of greater than 10 watts are currently commercially available, with emission wavelengths between 400 nm and 4000 nm. The above described lasers can be combined with beam delivery optics that reshape the emitted beam and direct it to the wafer. For example, the laser can be coupled with fiber optics for guiding the light onto a particular location of the wafer.

In an alternative embodiment, or in combination with the above embodiments, the tuning device can include a plurality of light pipes, such as optical fibers. The light energy of the tuning device can be distributed with the light pipes to at least two local areas within the chamber and/or the wafer. Preferably, the local areas are separated from each other and are illuminated by the same tuning device. The areas, however, can overlap or can be essentially identical, meaning that the two light pipes illuminate the same area. This tuning device configuration can be used for illuminating the wafer at the same region from the top and the bottom using a single tuning device, such as having e.g. the same spectral conditions for the top and the bottom illumination.

When using a plurality of light pipes for a single tuning device, the tuning device can also include a system of apertures or aperture plates having a predetermined pattern of apertures. In this embodiment, certain light pipes can be selected from the plurality of light pipes. For example, a laser, arc lamp or halogen lamp can be placed in communication with a plurality of light pipes. One of the light pipes can then be selected for transferring the light energy to the wafer. The particular light pipes selected can control the intensity of the energy transported through the pipe, having the advantage that no power control of the light source itself is necessary. Such a control can be difficult for certain lasers (e.g. super radiating systems like a spark pumped nitrogen laser) or arc lamps (e.g. in pulsed mode with very high current density).

Alternatively, instead of using a plurality of light pipes in conjunction with the above-mentioned apertures, the intensity of the light emitted from the tuning source can be controlled using polarization filters. Further, there is also the possibility of simply turning the tuning devices on and off independent of the primary heating lamps for controlling the irradiance distribution.

So as mentioned, the electomagnetic power of the tuning devices can be delivered to the specified regions of the wafer from either above or below the wafer, or from both sides. The latter case gives the advantage of reducing the possibility that there is poor power coupling because of the presence of a reflective coating on one side of the wafer. This concept can be applied equally well to the arc lamps or the laser sources, and it can be implemented by either having separate sources built into the chamber above and below the wafer, or through the use of light pipes as described above e.g. fibers that transmit the energy from the tuning device in these locations. The tuning devices could also irradiate the wafer edge from the side. This is especially useful in cases where a slip-free ring (i.e. a heating ring used to heat the edges of a wafer) is not present in the system. Light sources to be built into the side of the chamber, which would not interfere with the mechanical layout of the linear lamp rays so much, also can be used as tuning devices. Irradiation from the side can fall directly on the edge of the wafer, but it is also possible for the illumination to cause light to fall on the top and bottom surfaces of the wafer over a region close to the edge. This light can be incident at a rather large angle of incidence, and in this configuration it is quite convenient to achieve angles of incidence close to the critical angle for silicone (approximately 75° to the normal), where power coupling is strong, and coating effects could be minimized.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. An apparatus for heat treating semiconductor substrates comprising:
    a thermal processing chamber adapted to contain a semiconductor substrate;
    a substrate holder positioned within the thermal processing chamber, the substrate holder being configured to hold a semiconductor substrate in the chamber;
    a first heating device in communication with the thermal processing chamber for heating a semiconductor substrate contained in the chamber;
    a second heating device comprising a light energy source coupled to a light pipe;
    at least one temperature sensing device for sensing the temperature of a semiconductor substrate at least at one location; and
    a controller in communication with the at least one temperature sensing device and at least one of the first heating device or the second heating device, the controller being configured to control the amount of energy being emitted by at least one of the heating devices in response to temperature information received from the at least one temperature sensing device.

2. An apparatus as defined in claim 1, wherein the second heating device further comprises a focusing lens that is configured to focus light energy being emitted from the light pipe onto a semiconductor substrate in the chamber.

3. An apparatus as defined in claim 1, wherein the first heating device comprises a plurality of linear lamps configured to emit light energy onto a semiconductor substrate contained within the processing chamber, the linear lamps including a longest dimension that is positioned to face a semiconductor substrate located on the substrate holder.

4. An apparatus as defined in claim 1, wherein the second heating device comprises a plurality of light energy sources, each of the light energy sources being coupled to a corresponding light pipe.

5. An apparatus as defined in claim 1, wherein the light energy source of the second heating device comprises a laser.

6. An apparatus as defined in claim 1, wherein the light pipe is positioned such that light energy emitted from the light pipe is directed onto an outer edge of a semiconductor substrate in the chamber.

7. An apparatus as defined in claim 1, wherein the light source of the second heating device is configured to emit pulsed light.

8. An apparatus for heat treating semiconductor substrates comprising:
    a thermal processing chamber adapted to contain a semiconductor substrate;
    a substrate holder positioned within the thermal processing chamber, the substrate holder being configured to hold a semiconductor substrate in the chamber;
    a first heating device in communication with the thermal processing chamber for heating a semiconductor substrate contained in the chamber; and
    a second heating device comprising a light energy source in operative association with a lens, the lens being positioned so as to direct light energy being emitted by the light energy source onto a semiconductor substrate contained in the chamber, the lens being positioned within the thermal processing chamber.

9. An apparatus as defined in claim 8, wherein the light energy source of the second heating device is in operative association with a plurality of lenses.

10. An apparatus as defined in claim 8, wherein the lens is configured to focus light energy being emitted by the light energy source onto an outer edge area of a semiconductor substrate contained within the processing chamber.

11. An apparatus as defined in claim 9, wherein the plurality of lenses comprise a condensing lens set.

12. An apparatus as defined in claim 8, wherein the light energy source of the second heating device comprises an arc lamp.

13. An apparatus as defined in claim 8, further comprising a light pipe positioned in between the light energy source of the second heating device and the lens.

14. An apparatus for heat treating semiconductor substrates, the apparatus comprising:
 a thermal processing chamber adapted to contain a semiconductor substrate;
 a support structure adapted to support and rotate the semiconductor substrate; and
 a laser heating device comprising at least one laser, the heating device configured to irradiate the semiconductor substrate with at least two laser beams;
 wherein at least one beam comprises at least one different wavelength from another beam.

15. The apparatus set forth in claim 14, wherein the laser heating device is configured to irradiate the semiconductor substrate with at least two laser beams impinging at the same radius on the substrate.

16. The apparatus set forth in claim 14, wherein the laser beams impinging at the same radius impinge at different locations on the substrate.

17. The apparatus set forth in claim 14, wherein the laser beams impinge at the same location on the substrate.

18. The apparatus set forth in claim 14, wherein the laser heating device comprises a separate laser corresponding to each beam with which the substrate is irradiated.

19. An apparatus for heat treating semiconductor substrates, the apparatus comprising:
 a thermal processing chamber adapted to contain a semiconductor substrate;
 a radiant heating device configured to heat a semiconductor substrate in the chamber during processing; and
 at least one tuning device positioned to irradiate a semiconductor substrate with laser light that impinges on a top surface of the substrate and with laser light that impinges on a bottom surface of the substrate;
 wherein the laser light that impinges on the top surface of the substrate comprises at least one different wavelength than the laser light that impinges on the bottom surface of the substrate.

20. The apparatus set forth in claim 19, wherein the at least one tuning device comprises a first tuning device which irradiates the top surface and a second tuning device that irradiates the bottom surface.

21. The apparatus set forth in claim 19, wherein the tuning devices are positioned so that the respective laser light impinges on the substrate at the same relative location on the front and back of the semiconductor substrate.

22. The apparatus set forth in claim 19, further comprising a wafer support configured to support and rotate a wafer in the thermal processing chamber.

23. An apparatus for heat treating semiconductor substrates comprising:
 a thermal processing chamber adapted to contain a semiconductor substrate;
 a substrate holder positioned within the thermal processing chamber, the substrate holder being configured to hold a semiconductor substrate in the chamber;
 a first heating device in communication with the thermal processing chamber for heating a semiconductor substrate contained in the chamber;
 a second heating device comprising a light energy source coupled to a light pipe; and wherein the first heating device comprises a plurality of linear lamps configured to emit light energy onto a semiconductor substrate contained within the processing chamber, the linear lamps including a longest dimension that is positioned to face a semiconductor substrate located on the substrate holder.

\* \* \* \* \*